LARGE VOLUME SEMICONDUCTOR COATING REACTOR

Filed May 12, 1966 2 Sheets-Sheet 1

INVENTOR.
Cedric G. Currin
BY
Howard W. Kenmore [signature]
ATTORNEY

INVENTOR.
Cedric G. Currin
BY
Howard W. Hermann
ATTORNEY

United States Patent Office 3,460,510
Patented Aug. 12, 1969

3,460,510
LARGE VOLUME SEMICONDUCTOR COATING REACTOR

Cedric G. Currin, Midland, Mich., assignor to Dow Corning Corporation, Midland, Mich., a corporation of Michigan Filed May 12, 1966, Ser. No. 549,501
Int. Cl. C23c *13/02*
U.S. Cl. 118—48 9 Claims

ABSTRACT OF THE DISCLOSURE

Pyrolytic deposition of crystalline semiconductor material is deposited on a substrate in apparatus comprised of a cylindrically shaped susceptor having a plurality of vertically extending recesses. An aperture faces each of the recesses. A heating element is positioned coaxially with the susceptor element.

This invention relates to the fabrication of semiconductor electronic devices and solid state circuits, and more particularly relates to apparatus for use in the deposition of semiconductor material layers on semiconductor substrates.

In the production of semiconductor electronic devices such as transistors, diodes, and the like, it is often advantageous to deposit semiconductor material on a like or similar base crystal. Usually such deposition is carried on from vapor phase compounds upon a heated monocrystalline substrate, in which case the deposition film nucleates upon the substrate to join the lattice thereof to produce a single crystal structure. This technique is known as epitaxial growth.

Epitaxial crystal growth is applicable in general to semiconductors, including, for example, silicon, germanium and various compound materials. Quite often the technique is used to provide layers of different properties and during deposition, impurity dopants in vapor form are introduced toward the accomplishment of this end.

A variety of reactor designs are available for epitaxial deposition. To the knowledge of the present applicant, however, all available designs suffer from one basic limitation: the maximum number of substrate wafers that can be processed is limited by the pattern of gas flow in the reactor.

In order to produce a number of wafers with uniform thickness, resistivity, and crystallographic characteristics it is necessary that the gaseous environment for each substrate wafer be the same as that of each other wafer being processed. As a result, present reactors are suitable for only a limited number of wafers. This means that for large scale production, a large number of reactors is necessary and a great amount of time is lost in setting up reactors and taking them down.

It is an object of the present invention to provide a large volume semiconductor coating reactor.

A further object is the provision of a coating reactor which can be used for coating very large numbers of wafers uniformly with a maximum of efficiency.

In accordance with these and other objects there is provided by the present invention a large volume reactor which is made cylindrical in form. The wafers to be coated are mounted in a cylindrical array on a susceptor element and a reactant gas inlet is provided for each wafer in the array by provision of a perforated gas inlet chamber having ports or apertures at the location of each substrate face. The wafers may be slices of rods of semiconductor materials or other relatively thin bodies such as portions of dendritic web growth. The array is uniformly radiantly heated without danger of contamination of the semiconductor material by the heating element. The use of infrared radiation for heating also provides economies over other heating methods such as high frequency induction heating, for example. The unit is useful with any type of semiconductor materials.

The invention will become better understood by those skilled in the art, and further objects and advantages of the invention will be realized by a consideration of the following detailed description when read in conjunction with the accompanying drawings wherein.

Figure 1:
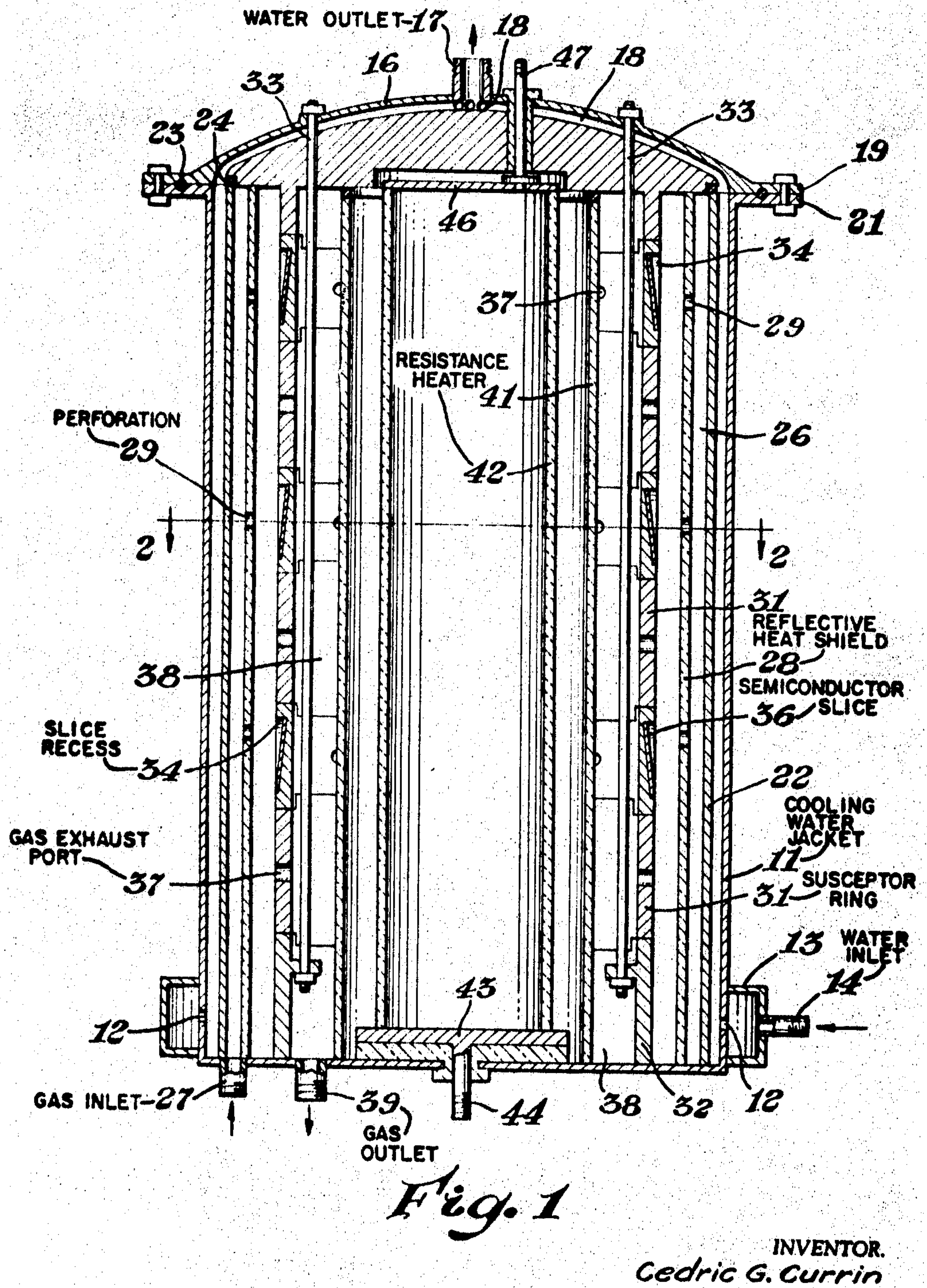
FIG. 1 is a vertical view in cross section of an embodiment of the present invention.
Figure 2:
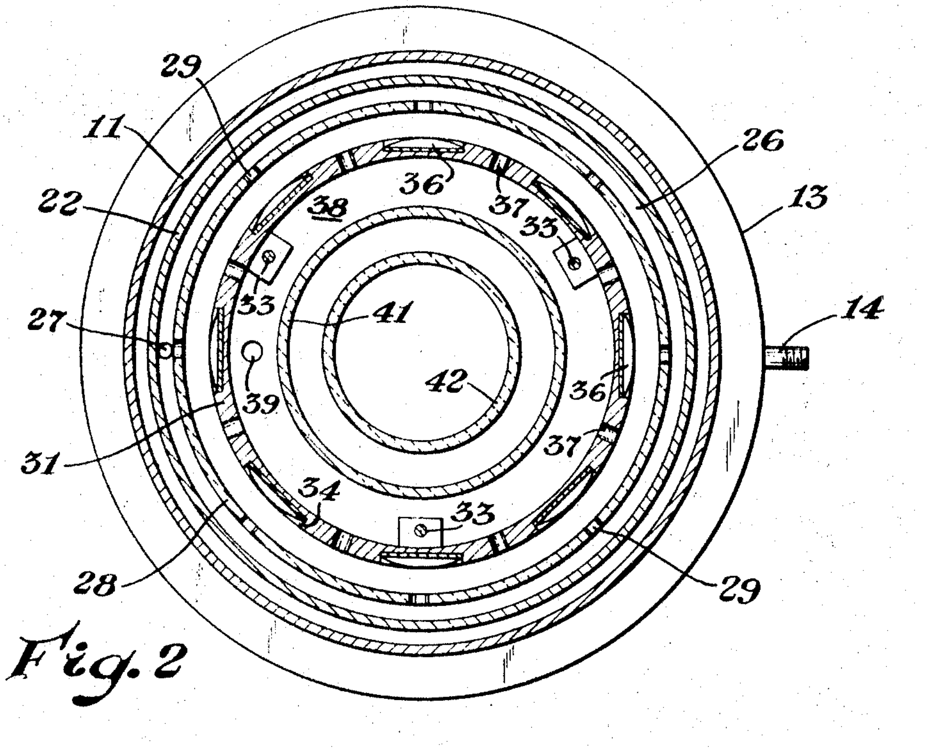
FIG. 2 is a cross sectional view of the embodiment of FIG. 1 taken along the line 2—2 of that figure and looking in the direction of the arrows.

Referring now to the drawings wherein like reference characters designate like parts throughout the figures thereof, there is shown in FIGS. 1 and 2 a generally cylindrical reactor according to the present invention having at its surface a water jacket 11 which may be made of steel, or the like. Positioned around the base of the water jacket 11 are a plurality of water inlet apertures 12 in communication with a water inlet ring 13 which has a water inlet connection 14 positioned thereon.

A closure lid 16, provided with a water outlet 17 and a plurality of radial conduits 18 positioned to interconnect the area confined by the water jacket 11 with the water outlet 17, is provided with fastening means such as flange 19 which may be secured to a corresponding flange 21 on the water jacket 11 by bolts or the like. An inner cylindrical jacket liner 22 is mounted concentrically with the outer jacket 11 in spaced relationship thereto. In order to prevent leakage of water between the closure lid 16 and the walls 11 and 22 of the water jacket, sealing means such as O-rings 23, 24 may be provided between the jacket liners and the lid.

The inner jacket liner 22 forms a cooled wall for a cylindrically shaped gas inlet chamber 26. A gas inlet 27 is provided for feeding reactant gases into the chamber 26. Since the reactant gases may be contaminated by reaction with the water jacket liner 22, the liner must be made of material which is chemically inert at the liner operating temperature, with respect to the reactant gases fed into the system. For deposition of silicon, stainless steel or molybdenum, for example, may be used.

Spaced radially inwardly from the cooling jacket and forming the inner boundary of the reactant gas inlet chamber 26 is an annular reflective heat shield member 28 having a plurality of perforations 29 therethrough. The perforations 29 are located at predetermined intervals for reasons which will become apparent hereinafter. The heat shield 28 is preferably made of quartz or a refractory metal such as molybdenum.

Figures 3, 4:
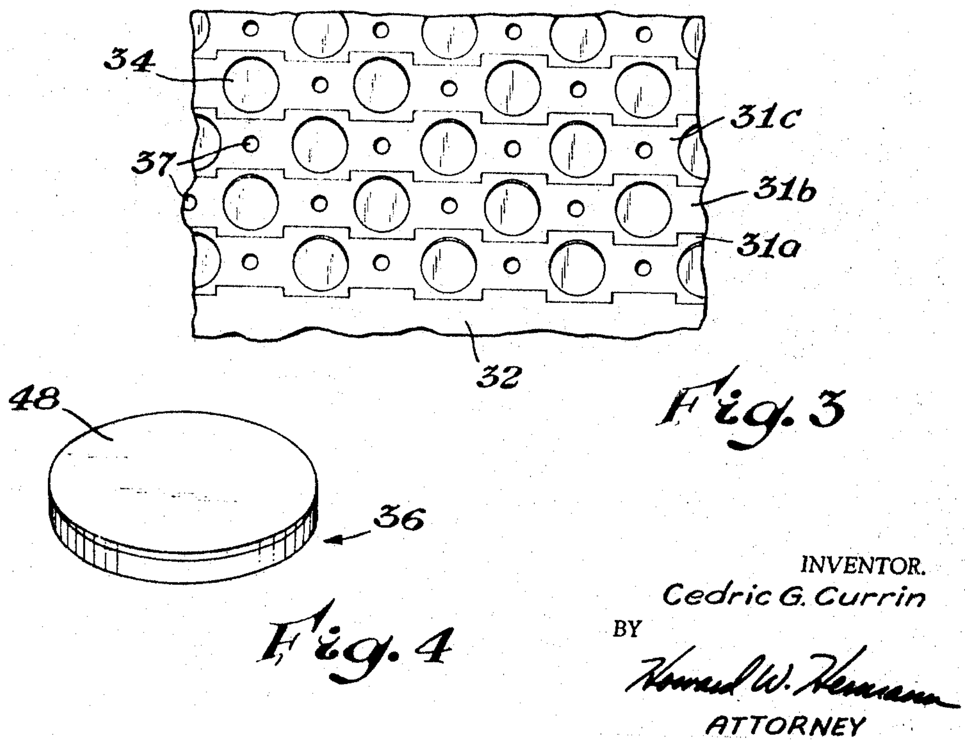
FIG. 3 is a fragmentary view of the array used in the embodiment of FIGS. 1 and 2.
FIG. 4 is a perspective view of a semiconductor slice having an epitaxial layer deposited thereon by processing in the reactor shown in FIGS. 1 through 3.

Spaced concentrically inwardly from the annular reflective heat shield is a cylindrical array 31 of stacked interlocking susceptor rings, details of which are shown in FIG. 3. The susceptor ring may be made of any known susceptor material suitable for semiconductor production such as quartz, molybdenum, or carbon coated with silicon carbide or nitride. A plurality of interlocking rings 31*a*, *b*, *c*, etc., are stacked on a base ring 32 which is attached to the reactor lid 16 by means such as a plurality of rods 33 to allow removal of the susceptor rings with the lid. The rings are provided with alternating wide and narrow segments of equal length to insure alignment when stacking and to maximize available space in the reactor. In the exterior surface of each of the wide segments are a plurality of circular recesses 34, each of which is located directly opposite one of the perforations 29 in the heat shield member 28. The inner surface of each recess is inclined at an angle which is preferably between 5° and 15° from the vertical. In use, a cylindrical slice 36 of semiconductor material or alternatively a length of dendritic web material, is placed in each recess, the inclination serving to hold the slice in place in the recess, and the recess serving to protect the back of the slice from deposition.

In the center of each narrow portion of each ring there is provided an exhaust port or aperture 37 for conducting gases radially through the susceptor rings and into an exhaust chamber 38 which is provided with an exhaust outlet 39. The inner wall 41 of the exhaust chamber 38 is formed of an infrared transmitting material suitable for operation at temperatures up to at least about 1300° C. Quartz is suitable for this purpose.

Mounted at the center of the reactor is a cylindrical heating element 42 having a high infrared output. This may, for example, be a picket-type carbon heater or a resistance heater of refractory metal deposited on a suitable substrate. An electrical contact 43 insulated from the bottom of the reaction chamber has a connector 44 passing through the chamber wall and a contact 46 at the top of the element is detachably connected to an electrical terminal 47 passing through the lid 16 of the chamber. The terminals 44, 47 are adapted to be connected to a suitable source of electrical power to energize the heating element 42.

In use, a plurality of semiconductor slices are placed in the recesses of the susceptor rings 31 and the lid 16 with the loaded susceptor array is lowered onto the chamber and affixed thereto. The electrical terminals 44, 47 are connected to a suitable power supply, and a water drain is connected to water outlet 17 in the lid. A reaction gas mixture, silicon tetrachloride and hydrogen for example, is fed into the gas inlet 27. It is to be understood that in order to purge the system or clean the slices, suitable purge gases or gaseous etchants may be passed through the system prior to introduction of the reactant gas. With the heater input power controlled to provide the semiconductor slices with the proper amount of heat for pyrolytic deposition thereon the reactant gases flow out of the ports 29 in the heat shield member 28 and are directed onto the surfaces of the heated semiconductor slices where deposition of semiconductor material takes place. The spent gases then travel out of the exhaust ports 37, through the exhaust chamber 38 and out of the system by way of the exhaust outlet 39. Deposition is continued for a time necessary to produce a coating 48 (FIG. 4) of the desired depth on the slices 36.

Various modifications and variations are possible in the light of the above teachings. For example, means may be provided for rotating the heating element or the susceptor if desired, to provide more uniform heat to the susceptor rings. In such case, the bearing for rotation is preferably gas cooled. If desired, the susceptor may be made of electrically conductive material and heated by induction heat either by itself or in conjunction with the infrared radiant heat source. In such case, the infrared elements or the induction heater may be mounted at the center of the configuration. If desired, the slice array may be arranged at the inner surface of the array and gases may flow radially outward rather than inward.

Various other variations and modifications are contemplated within the scope of the present invention and will occur to those skilled in the art. It is to be understood, therefore, that within the scope of the appended claims the invention may be practiced otherwise than as specifically described.

That which is claimed is:

1. Apparatus for producing crystal growth upon a semiconductor crystal substrate by pyrolytic deposition from gaseous phase materials comprising:
- a cylindrically-shaped susceptor element having a plurality of vertically extending recesses therein in which slices of said semiconductor substrate are placed,
- an inlet aperture facing each of said vertically extending recesses for radially inducing a flow of said gaseous phase materials across the exposed portions of said slices of the semiconductor substrate, and
- a heating element positioned coaxially with said susceptor element for raising the temperature of said susceptor sufficiently high for deposition on said substrate wafers.

2. Apparatus as defined in claim 1 and further including aperture means through said susceptor element intermediate said plurality of recesses for allowing spent gases to pass through said susceptor element.

3. Apparatus as defined in claim 1 wherein said recesses are each inclined at an angle of between 5° and 15° from the vertical to prevent said wafers of semiconductor substrate from falling from the recesses.

4. Apparatus as defined in claim 3 wherein said heating means comprise a resistive heating element positioned coaxially with said susceptor element.

5. Apparatus as defined in claim 4 wherein said susceptor element comprises a plurality of stacked interlocking rings each having a plurality of said recesses in the exterior surface thereof.

6. Apparatus as defined in claim 5 wherein each of said rings includes aperture means through said susceptor element intermediate said plurality of recesses for allowing spent gases to pass through said susceptor element.

7. Apparatus as defined in claim 6 wherein each of said rings comprises alternately wide and narrow sections of equal length, said recesses being positioned in said wide sections and said apertures being positioned in said narrow portions.

8. Apparatus as defined in claim 7 wherein said wide portions of alternate rings are located in the same radial position in said cylindrically shaped susceptor element as the narrow portions of the rings intermediate said alternate rings whereby the rings are interlocked in position.

9. Apparatus as defined in claim 1 wherein said susceptor element comprises a plurality of stacked interlocking rings each having a plurality of said recesses in the exterior surface thereof.

References Cited

UNITED STATES PATENTS

| | | | |
|---|---|---|---|
| 3,020,128 | 2/1962 | Adcock | 118—48 |
| 3,131,098 | 4/1964 | Krsek | 118—48 |
| 3,190,771 | 6/1965 | McLean | 118—49.1 |
| 3,206,331 | 9/1965 | Diefendorf | 118—49.1 |
| 3,220,380 | 11/1965 | Schaarschmidt | 118—48 |
| 3,226,254 | 12/1965 | Reuschel | 118—49.5 |
| 3,361,591 | 1/1968 | Dill | 118—49.1 |

OTHER REFERENCES

IBM Technical Disclosure Bulletin, vol. 6, No. 6, November 1963, p. 1, by R. A. Connell et al.

NORMAN YUDKOFF, Primary Examiner

U.S. Cl. X.R.

23—273, 278, 294; 117—106